(12) United States Patent
Takehara

(10) Patent No.: US 10,236,423 B2
(45) Date of Patent: Mar. 19, 2019

(54) LIGHT-EMITTING DEVICE

(71) Applicant: PANASONIC INTELLECTUAL PROPERTY MANAGEMENT CO., LTD., Osaka (JP)

(72) Inventor: Kosuke Takehara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/412,364

(22) Filed: Jan. 23, 2017

(65) Prior Publication Data

US 2017/0213942 A1 Jul. 27, 2017

(30) Foreign Application Priority Data

Jan. 25, 2016 (JP) ................................ 2016-011303

(51) Int. Cl.
| | |
|---|---|
| *H01L 33/50* | (2010.01) |
| *H01L 27/15* | (2006.01) |
| *H01L 33/56* | (2010.01) |
| *H01L 33/62* | (2010.01) |
| *H01L 25/075* | (2006.01) |

(52) U.S. Cl.
CPC ........ *H01L 33/504* (2013.01); *H01L 25/0753* (2013.01); *H01L 27/156* (2013.01); *H01L 33/56* (2013.01); *H01L 33/62* (2013.01); *H01L 2224/48091* (2013.01); *H01L 2224/48227* (2013.01); *H01L 2924/181* (2013.01)

(58) Field of Classification Search
CPC .............................. H01L 27/156; H01L 33/56
See application file for complete search history.

(56) References Cited

U.S. PATENT DOCUMENTS

| | | | | |
|---|---|---|---|---|
| 5,424,006 | A * | 6/1995 | Murayama | C09K 11/7734 252/301.4 R |
| 9,704,834 | B2 * | 7/2017 | Konishi | H01L 25/0753 |
| 2008/0128735 | A1 * | 6/2008 | Yoo | C09K 11/0883 257/98 |
| 2012/0057339 | A1 * | 3/2012 | Mitsuishi | H01L 25/0753 362/231 |

FOREIGN PATENT DOCUMENTS

JP 2011-108742 6/2011

* cited by examiner

*Primary Examiner* — Trang Q Tran
(74) *Attorney, Agent, or Firm* — Greenblum & Bernstein P.L.C.

(57) ABSTRACT

A light-emitting device includes a plurality of light-emitting elements, a phosphorescent phosphor layer including a green phosphorescent phosphor that emits green light and has an afterglow property, and a sealing resin that disperses the green phosphorescent phosphor. The light-emitting device includes a red phosphor that emits red light, a sealing resin that disperses the red phosphor, and a red phosphor layer that contains only a red phosphor as a phosphor. The phosphorescent phosphor layer and the red phosphor layer are disposed apart from each other, and the light-emitting device emits white light while electric current is supplied to the plurality of light-emitting elements, and emits green light after ending the supply of the electric current to the light-emitting elements.

13 Claims, 6 Drawing Sheets

LIGHT-EMITTING DEVICE

BACKGROUND OF THE INVENTION

Technical Field

The present invention relates to a light-emitting device. Specifically, the present invention relates to a light-emitting device capable of obtaining high light emission efficiency.

Background Art

Heretofore, an LED lamp including a light emitting diode (LED) has been used in many purposes such as a signal lamp, a cellular phone, a variety of illuminated signs, an on-vehicle display, and a variety of display devices. Moreover, research and development have been conducted for a light-emitting device realizing light with a hue, which is different from that of a luminescent color of the light emitting diode, by combining, with the light emitting diode, a phosphor that is excited by light radiated from the light emitting diode and radiates light with a longer wavelength.

As this type of light-emitting device, a white light-emitting device (white LED) has been commercialized, which realizes a white emission spectrum, for example, by combining the light emitting diode and the phosphor with each other. Such a lighting white LED as described above is expected to become a light source, which serves as an alternate from a fluorescent lamp and gives a little environmental load, by making use of such advantages as "long life" and "mercury free".

Moreover, in recent years, research and development have also been conducted for a lighting device including a phosphorescent material that keeps on emitting an afterglow for a fixed time even under a situation where electricity cannot be supplied like a time of disaster and a time of blackout. For example, Japanese Unexamined Patent Application Publication No. 2011-108742 discloses a lighting device including: a substrate; one or more light-emitting elements arranged on the substrate; a phosphor layer that emits light by being excited by light radiated from the light-emitting elements; and a phosphorescent substance layer stacked on one surface of the phosphor layer directly or through other layer. Furthermore, this publication discloses that the phosphorescent substance layer is stacked on a surface of the phosphor layer, which is opposite with a surface thereof facing to the phosphor layer.

SUMMARY OF THE INVENTION

However, in the lighting device of Japanese Unexamined Patent Application Publication No. 2011-108742, the light emitted from the phosphor is radiated to an outside through the phosphorescent substance layer, and accordingly, the light emitted from the phosphor is absorbed by the phosphorescent substance layer in some case. Therefore, there has been a problem that a loss of color conversion is increased to decrease light emission efficiency at a time of the light emission and a time of the afterglow.

The present invention has been made in consideration of such a problem as described above, which is inherent in the prior art. Then, it is an object of the present invention to provide a light-emitting device that suppresses the decrease of the light emission efficiency at the time of the light emission and the time of the afterglow.

A light-emitting device according to an aspect of the present invention includes: a plurality of light-emitting elements; a phosphorescent phosphor layer; and a red phosphor layer. The phosphorescent phosphor layer includes: a green phosphorescent phosphor that emits green light and has an afterglow property; and a sealing resin that disperses the green phosphorescent phosphor. The red phosphor layer includes: a red phosphor that emits red light; and a sealing resin that disperses the red phosphor, and further, contains only the red phosphor as a phosphor. Then, the phosphorescent phosphor layer and the red phosphor layer are disposed apart from each other. Moreover, the light-emitting device emits white light while electric current is supplied to the light-emitting elements, and emits green light after ending supplying of the electric current to the plurality of light-emitting elements.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

Figure 1:
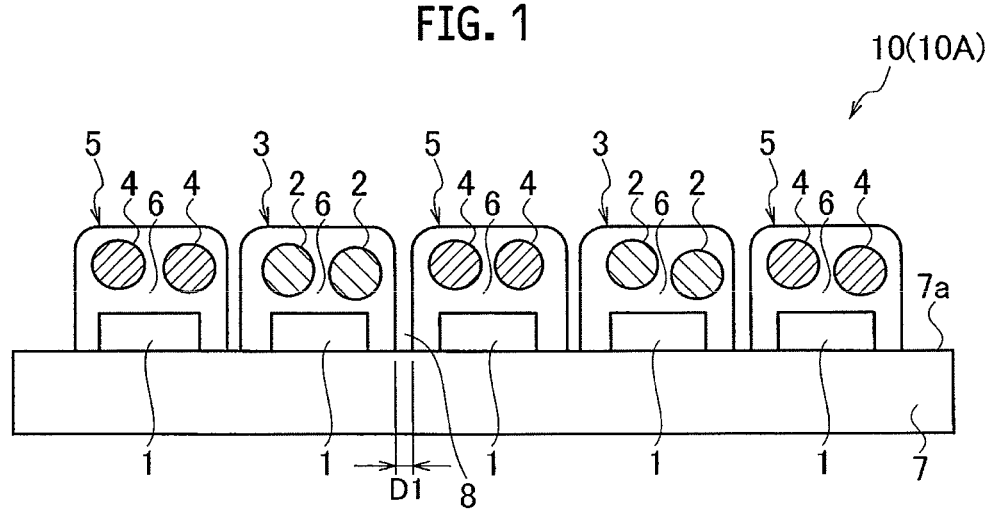
FIG. 1 is a cross-sectional view schematically showing an example of a light-emitting device according to an embodiment of the present invention.

A description is made in detail of a light-emitting device according to this embodiment while referring to the drawings. Note that, for convenience of explanation, dimensions and ratios of the drawings cited in the following embodiment are exaggerated, and are different from actual ratios in some case.

[First Embodiment]

Figure 3:
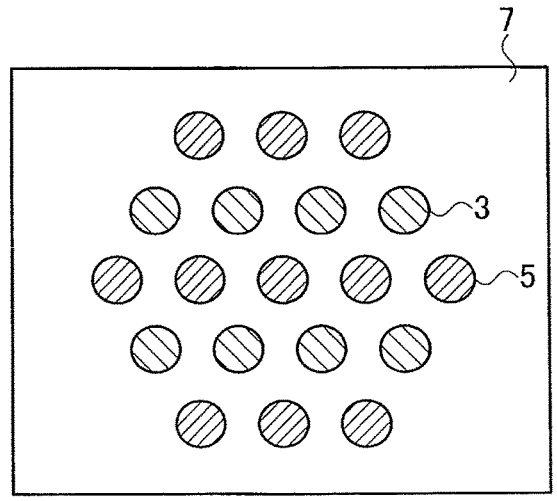
FIG. 3 is a plan view showing a modification example of the light-emitting device.

As shown in FIG. 1 and FIG. 3, a light-emitting device 10 according to this embodiment includes: light-emitting elements 1; phosphorescent phosphor layers 3 containing a green phosphorescent phosphor 2; and red phosphor layers 5 containing a red phosphor 4. The phosphorescent phosphor layers 3 include: the green phosphorescent phosphor 2 that emits green light and has an afterglow property; and sealing resin 6 that disperses the green phosphorescent phosphor.

Moreover, the red phosphor layers 5 include: a red phosphor 4 that emits red light; and sealing resin 6 that disperses the red phosphor, and further, contains only the red phosphor 4 as a phosphor.

Each of the light-emitting elements 1 in the light-emitting device 10 is a solid light-emitting element that emits light exciting the green phosphorescent phosphor 2 and the red phosphor 4. Specifically, the light-emitting element 1 that is a light source generating primary light is an photoelectric conversion element that converts electric energy into energy of light such as a near ultraviolet ray, violet light and blue light by being supplied with electric power that applies thereto at least one voltage selected from among a direct current, an alternating current and a pulse. Then, in the light-emitting device 10, a plurality of the light-emitting elements 1 are mounted on a mounting surface 7a of a substrate 7.

As the light-emitting element 1, there can be used a light emitting diode (LED), an inorganic electroluminescence (EL) element, an organic EL element and the like. In particular, it is preferable that the light-emitting element 1 be the LED in order to obtain high-output primary light. Moreover, it is more preferable that the light-emitting element 1 be an ultraviolet/violet light emitting diode that emits light having a light emission peak in a wavelength range of 240 nm or more to 430 nm or less or a blue light emitting diode that emits light having a light emission peak in a wavelength range of more than 430 nm to 500 nm or less. Specifically, as the light-emitting element 1, there can be used a violet LED that has an output peak wavelength of 405 nm and uses indium gallium nitride, and a blue LED that has an output peak wavelength of 450 nm and uses indium gallium nitride.

As shown in FIG. 1 and FIG. 3, the phosphorescent phosphor layer 3 covers and seals the light-emitting element 1. Then, the phosphorescent phosphor layer 3 absorbs short-wavelength light emitted by the light-emitting element 1, and performs wavelength conversion for the absorbed short-wavelength light into longer-wavelength light, and meanwhile, emits green light as an afterglow for a fixed time even after the light-emitting element 1 turns off. As the green phosphorescent phosphor 2 contained in the phosphorescent phosphor layer 3, a phosphor having an absorption peak in a range of 240 nm to 500 nm and a light emission peak in a range of 490 nm to 550 nm can be used. Moreover, the green phosphorescent phosphor 2 absorbs excitation energy from the light-emitting element 1, and emits green light as an afterglow for a fixed time even after the light-emitting element 1 turns off. The green phosphorescent phosphor 2 is not particularly limited; however, for example, a cerium-activated zinc sulfide-based phosphor and a europium-activated alkaline earth aluminate-based phosphor can be used as the green phosphorescent phosphor 2. Specifically, as the green phosphorescent phosphor 2, there can be mentioned $SrAl_2O_4$:Eu,Dy; $Sr_4Al_{14}O_{25}$:Eu,Dy; ZnS:Ce and the like.

As the sealing resin 6 in the phosphorescent phosphor layer 3, a material can be used, which stably disperses the green phosphorescent phosphor 2, and further, has a high light transmittance at least in the visible light range of 380 nm to 780 nm. As the sealing resin, at least one type can be used, which is selected from the group consisting of silicone resin, fluorine-based resin, low-melting-point glass and sol-gel glass.

As shown in FIG. 1 and FIG. 3, the red phosphor layer 5 also covers and seals the light-emitting element 1 in a similar way to the phosphorescent phosphor layer 3. Then, the red phosphor layer 5 absorbs short-wavelength light emitted by the light-emitting element 1, and performs wavelength conversion for the absorbed short-wavelength light into red light that is longer-wavelength light than the absorbed short-wavelength light. As the red phosphor 4 contained in the red phosphor layer 5, a phosphor having an absorption peak in a range of 240 nm to 600 nm and a light emission peak in a range of 600 nm to 770 nm can be used. The red phosphor 4 as described above is not particularly limited; however, $CaAlSiN_3$:Eu, $(Sr,Ca)CaAlSiN_3$:Eu and the like can be mentioned as the red phosphor 4. Moreover, as the red phosphor 4, there can also be mentioned $Sr_2Si_5N_8$:$Eu^{2+}$, $SrAlSi_4N_7$:$Eu^{2+}$, CaS:$Eu^{2+}$, $La_2O_2S$:$Eu^{3+}$, $Y_3Mg_2(AlO_4)(SiO_4)_2$:$Ce^{3+}$, $Y_2O_3$:$Eu^{3+}$, $Y_2O_2S$:$Eu^{3+}$$Y(P,V)O_4$:$Eu^{3+}$ and the like.

As the sealing resin 6 in the red phosphor layer 5, a material can be used, which stably disperses the red phosphor 4, and further, has a high light transmittance at least in the visible light range of 380 nm to 780 nm. As the sealing resin, a similar one to the phosphorescent phosphor layer 3 can be used.

It is necessary that the phosphorescent phosphor layer 3 contain at least the green phosphorescent phosphor 2 as the phosphor. However, the phosphorescent phosphor layer 3 may contain a phosphorescent phosphor other than the green phosphorescent phosphor 2. As the phosphorescent phosphor as described above, there can be mentioned: a blue phosphorescent phosphor that absorbs the excitation energy from the light-emitting element 1 and emits blue light as an afterglow for a fixed time also after the light-emitting element 1 turns off; an orange phosphorescent phosphor that emits orange light as an afterglow in the same way; and a red phosphorescent phosphor that emits red light as an afterglow in the same way. For example, (Ca,Sr)S:Bi and $CaAl_2O_4$:Eu,Nd can be mentioned as the blue phosphorescent phosphor. ZnS:Cu,Mn,Co can be mentioned as the orange phosphorescent phosphor. CaS:Eu,Tm, $Y_2O_2S$:Eu,Mg,Ti can be mentioned as the red phosphorescent phosphor.

The phosphorescent phosphor layer 3 can also contain a phosphor, which does not have phosphorescent property, as well as the phosphors, which have the phosphorescent property, such as the green phosphorescent phosphor 2, the blue phosphorescent phosphor, the orange phosphorescent phosphor and the red phosphorescent phosphor, which are mentioned above. That is to say, the phosphorescent phosphor layer 3 can contain at least one selected from the group consisting of the blue phosphor, the green blue or blue green phosphor, the green phosphor and the yellow or orange phosphor. As the blue phosphor, there are mentioned $BaMgAl_{10}O_{17}$:$Eu^{2+}$, $CaMgSi_2O_6$:$Eu^{2+}$, $Ba_3MgSi_2O_8$:$Eu^{2+}$, $Sr_{10}(PO_4)_6Cl_2$:$Eu^{2+}$, and the like. As the green blue or blue green phosphor, there are mentioned $Sr_4Si_3O_8Cl_4$:$Eu^{2+}$, $Sr_4Al_{14}O_{24}$:$Eu^{2+}$, $BaAl_8O_{13}$:$Eu^{2+}$, and $Ba_2SiO_4$:$Eu^{2+}$. Moreover, as the green blue or blue green phosphor, there are mentioned $BaZrSi_3O_9$:$Eu^{2+}$, $Ca_2YZr_2(AlO_4)_3$:$C^{3+}$, $Ca_2YHf_2(AlO_4)_3$:$Ce^{3+}$, and $Ca_2YZr_2(AlO_4)_3$:$Ce^{3+}$,$Tb^{3+}$. As the green phosphor, there are mentioned $(Ba,Sr)_2SiO_4$:$Eu^{2+}$, $Ca_8Mg(SiO_4)_4Cl_2$:$Eu^{2+}$, and $Ca_8Mg(SiO_4)_4Cl_2$:$Eu^{2+}$,$Mn^{2+}$. Moreover, as the green phosphor, there are mentioned $BaMgAl_{10}O_{17}$:$Eu^{2+}$,$Mn^{2+}$, $CeMgAl_{11}O_{19}$:$Mn^{2+}$, $Y_3Al_2(AlO_4)_3$:$Ce^{3+}$, and $Lu_3Al_2(AlO_4)_3$:$Ce^{3+}$. Furthermore, as the green phosphor, there are mentioned $Y_3Ga_2(AO_4)_3$:$Ce^{3+}$, $Ca_3Sc_2Si_3O_{12}$:$Ce^{3+}$, $CaSc_2O_4$:$Ce^{3+}$, $\beta$-$Si_3N_4$:$Eu^{2+}$, and $SrSi_2O_2N_2$:$Eu^{2+}$. As the green phosphor, there are mentioned $Ba_3Si_6O_{12}N_2$:$Eu^{2+}$, $Sr_3Si_{13}Al_3O_2N_{21}$:$Eu^{2+}$, $YTbSi_4N_6C$:$Ce^{3+}$, and $SrGa_2S_4$:$Eu^{2+}$. As the green phosphor, there are mentioned $Ca_2LaZr_2(AlO_4)_3$:$Ce^{3+}$, $Ca_2TbZr_2(AlO_4)_3$:$Ce^{3+}$, and $Ca_2TbZr_2(AlO_4)_3$:$Ce^{3+}$,$Pr^{3+}$. As the yellow or orange phosphor, there are mentioned $(Sr,Ba)_2SiO_4$:$Eu^{2+}$, $(Y,Gd)_3Al_5O_{12}$:$Ce^{3+}$, and $\alpha$-Ca—SiAlON:$Eu^{2+}$. As the yellow or orange phosphor, there are mentioned $Y_2Si_4N_6C$:$Ce^{3+}$, $La_3Si_6N_{11}$:$Ce^{3+}$, and $Y_3MgAl(AlO_4)_2(SiO_4)$:$Ce^{3+}$.

The phosphorescent phosphor layer 3 may contain only the green phosphorescent phosphor 2 as the phosphor. Specifically, the phosphorescent phosphor layer 3 may have a mode of not containing the blue phosphorescent phosphor, the orange phosphorescent phosphor, the red phosphorescent phosphor, the blue phosphor, the green blue or blue green phosphor, the green phosphor, the yellow or orange phosphor, which are mentioned above, but containing only the green phosphorescent phosphor 2 as the phosphor. In this case, other phosphors do not coexist, and only the green phosphorescent phosphor 2 intensively absorbs the excitation energy from the light-emitting element 1, and accordingly, it becomes possible to further enhance afterglow property after the light-emitting element 1 turns off. Moreover, color conversion by the other phosphors is reduced, and accordingly, it becomes possible to suppress an energy loss caused by the color conversion, and to enhance light emission efficiency at a time when the light-emitting element 1 turns on as usual.

Moreover, a spectrum of the green phosphorescent phosphor 2 has a peak in a range where spectral luminous efficiency in a scotopic vision is high, and accordingly, it becomes possible to enhance an illuminance in darkness at a time of the afterglow by enhancing the afterglow property of the green phosphorescent phosphor 2. That is to say, sensitivity of eyes, which differs depending on the wavelength of the light, includes not only a sense to color but also a sense to brightness. Even if energies of the light of the respective colors are the same, the yellow light and the green light look bright; however, the red light and the blue light look dark. Then, a maximum wavelength of standard spectral luminous efficiency in the scotopic vision is 507 nm, and overlaps a light emission wavelength in the green phosphorescent phosphor 2 at the time of the afterglow. Therefore, it becomes possible to increase the illuminance of the phosphorescent phosphor layer 3 and enhance visibility by enhancing the afterglow property of the green phosphorescent phosphor 2.

The red phosphor layer 5 contains only the red phosphor 4, which does not have the afterglow property, as the phosphor. That is to say, the red phosphor layer 5 does not contain the other phosphors and phosphorescent phosphors, but contains only the red phosphor 4 as the phosphor. In this case, the other phosphors do not coexist, and only the red phosphor 4 intensively absorbs the excitation energy from the light-emitting element 1. Therefore, the color conversion by the other phosphors is reduced, and accordingly, it becomes possible to suppress the energy loss caused by the color conversion, and to enhance the light emission efficiency at the time when the light-emitting element 1 turns on as usual.

Moreover, in a case where the red phosphor layer 5 contains only the red phosphor 4 as the phosphor, then the yellow light that reduces color rendering property, that is, light in a wavelength range of 570 nm to 600 nm can be reduced. Moreover, the green light that enhances the color rendering property, that is, light in a wavelength range of 500 nm to 540 nm can be radiated by the green phosphorescent phosphor 2, and the red light that enhances the color rendering property, that is, light in a wavelength range of 600 nm to 630 nm can be radiated by the red phosphor 4. Therefore, it becomes possible to efficiently enhance color rendering property of the obtained light.

Figure 4:
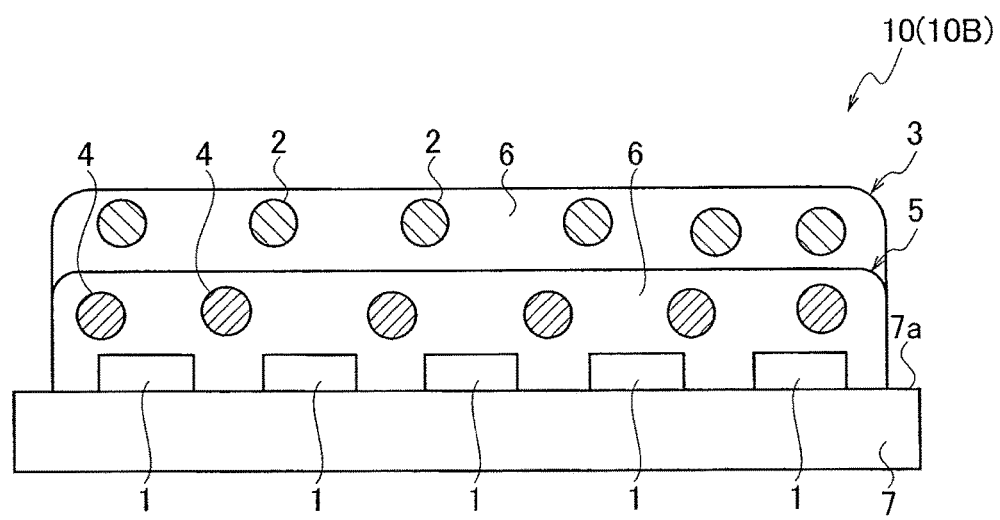
FIG. 4 is a cross-sectional view schematically showing an example of the light-emitting device according the embodiment of the present invention.

In the light-emitting device 10 of this embodiment, such phosphorescent phosphor layers 3 and such red phosphor layers 5 are disposed apart from each other. Specifically, as shown in FIG. 1, the phosphorescent phosphor layers 3 and the red phosphor layers 5 are separated from each other in a horizontal direction with respect to the mounting surface 7a for the plurality of light-emitting elements 1. Alternatively, as shown in FIG. 4, the phosphorescent phosphor layers 3 and the red phosphor layers 5 are separated from each other in a vertical direction with respect to the mounting surface 7a for the light-emitting element 1. The phosphorescent phosphor layers 3 and the red phosphor layers 5 are disposed apart from each other, whereby it becomes easy for the red phosphor 4 to absorb the excitation energy from such light-emitting elements 1, and it becomes possible to enhance the light emission efficiency. That is to say, as mentioned above, the red phosphor layers 5 contain only the red phosphor 4 as the phosphor, and do not contain the other phosphors and phosphorescent phosphors. Therefore, the absorption of the excitation energy, which is performed by the other phosphors and phosphorescent phosphors, the excitation energy coming from the light-emitting elements 1, is suppressed. Accordingly, the energy loss caused by the color conversion can be reduced, and it becomes possible to enhance the light emission efficiency of the light-emitting device 10 at a time when the light-emitting device 10 turns on as usual.

Here, an emission spectrum of the green phosphorescent phosphor 2 and an absorption spectrum of the red phosphor 4 partially overlap each other in some case. Therefore, in a case where the green phosphorescent phosphor and the red phosphor are allowed to coexist with each other in a single layer, since the green phosphorescent phosphor and the red phosphor are located close to each other, there has been a case where the light radiated from the green phosphorescent phosphor 2 is absorbed by the red phosphor 4, and the green light is reduced. Moreover, in a case where the green light emitted from the green phosphorescent phosphor 2 is absorbed by the red phosphor 4, the green light is subjected to the color conversion into the red light by the red phosphor 4. However, since the spectral luminous efficiency of the red light in the scotopic vision is low, there has been a case where there decreases the illuminance in the darkness at the time of the afterglow.

However, the phosphorescent phosphor layers 3 and the red phosphor layers 5 are disposed apart from each other, whereby the green light emitted by the green phosphorescent phosphor 2 becomes less likely to be absorbed by the red phosphor 4. Therefore, it becomes possible to reduce the energy loss caused by the color conversion, and to enhance the light emission efficiency at the time when the light-emitting device 10 turns on as usual. Moreover, the green light having high spectral luminous efficiency in the scotopic vision can be emitted efficiently, and accordingly, it becomes possible to suppress the decrease of the illuminance in the darkness at the time of the afterglow, and to enhance the visibility.

As shown in FIG. 1, in a light-emitting device 10A of this embodiment, it is preferable that the phosphorescent phosphor layers 3 and the red phosphor layers 5 be separated from each other in the horizontal direction with respect to the mounting surface 7a for the light-emitting elements 1. In this case, one or plurality of the light-emitting elements 1 are sealed by the phosphorescent phosphor layers 3. In a similar way, one or plurality of the light-emitting elements 1 are sealed by the red phosphor layers 5. Moreover, as shown in FIG. 1, it is preferable that gaps 8 exist between the phosphorescent phosphor layers 3 and the red phosphor layers 5. In such a way, the green light emitted by the green phosphorescent phosphor 2 becomes less likely to be absorbed by the red phosphor 4, and it becomes possible to enhance the light emission efficiency and the visibility in the darkness. Note that a distance D1 of the gaps 8 between the phosphorescent phosphor layers 3 and the red phosphor layers 5, which are adjacent to each other, is not particularly limited; however, can be set to, for example, 0.2 mm to 3.0 mm.

Figure 2:
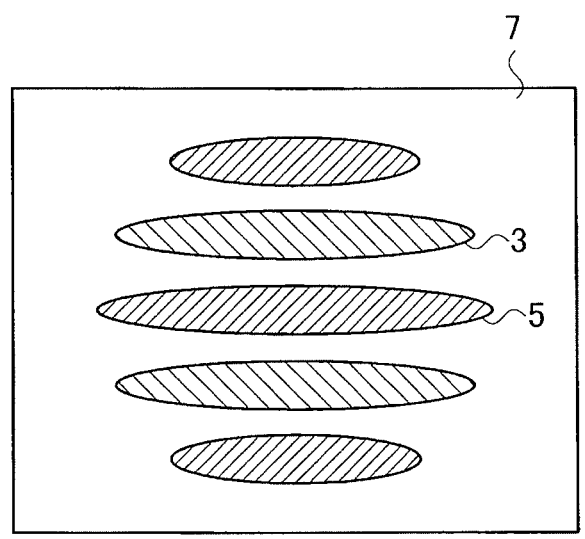
FIG. 2 is a plan view showing a modification example of the light-emitting device.

In the light-emitting device 10A, it is preferable that a shape of at least one of the phosphorescent phosphor layers 3 and the red phosphor layers 5 be linear. That is to say, as shown in FIG. 2, in a case of viewing the light-emitting device 10A from the above, it is preferable that the shape of the at least one of the phosphorescent phosphor layers 3 and the red phosphor layers 5 be linear, and it is more preferable that shapes of both of the phosphorescent phosphor layers 3 and the red phosphor layers 5 be linear. In this event, a configuration can be adopted, in which the plurality of light-emitting elements 1 are arranged in line to form each element line, and each element line is sealed by the linear phosphorescent phosphor layer 3 or the red phosphor layer 5.

As shown in FIG. 4, even if all of the light-emitting elements 1 are sealed by the phosphorescent phosphor layer 3 and the red phosphor layer 5, each of which is a single layer, the effects of this embodiment can be obtained. However, in such a case where all of the light-emitting elements 1 are sealed by the phosphorescent phosphor layer 3 and the red phosphor layer 5, each of which is a single layer, in an event where the light-emitting elements 1 generate heat, center portions of the phosphorescent phosphor layer 3 and the red phosphor layer 5, each of which is a sealing member, are prone to raise temperatures more than temperatures of outer edge portions thereof. That is to say, the center portions of the sealing members are less likely to radiate heat since outsides thereof are surrounded by the outer edge portions, and meanwhile, the outer edge portions are easy to radiate heat since outsides thereof are in contact with the air. As for characteristics of the LED, brightness of the LED decreases at an extremely high temperature, and accordingly, the brightness decrease of the LED is prone to occur in the center portions of the sealing members, resulting in brightness unevenness and color unevenness of the light-emitting device.

However, the shape of the at least one of the phosphorescent phosphor layers 3 and the red phosphor layers 5 is linear, whereby the heat of the light-emitting elements 1 becomes easy to radiate to the outside through the phosphorescent phosphor layers 3 and the red phosphor layers 5. Therefore, it becomes possible to prevent overheating of the light-emitting elements 1 and to suppress the brightness unevenness and color unevenness of the light-emitting device 10A.

In a case where the shapes of the phosphorescent phosphor layers 3 and the red phosphor layers 5 are linear, it is preferable that the plurality of phosphorescent phosphor layers 3 and the plurality of red phosphor layers 5 be disposed alternately with each other. As shown in FIG. 2, the phosphorescent phosphor layers 3 and the red phosphor layers 5 are disposed alternately with each other, whereby color mixing made by the green light from the phosphorescent phosphor layers 3 and the red light from the red phosphor layers 5 is performed efficiently, and it becomes possible to further suppress the color unevenness of the light-emitting device.

In the light-emitting device 10A, it is preferable that the shape of the at least one of the phosphorescent phosphor layers 3 and the red phosphor layers 5 be dot-like. That is to say, as shown in FIG. 3, in the case of viewing the light-emitting device 10A from the above, it is preferable that the shape of the at least one of the phosphorescent phosphor layers 3 and the red phosphor layers 5 be dot-like, and it is more preferable that shapes of both of the phosphorescent phosphor layers 3 and the red phosphor layers 5 be dot-like. In this event, a configuration can be adopted, in which each of the plurality of light-emitting elements 1 is sealed by the phosphorescent phosphor layers 3 or the red phosphor layers 5. The shape of the at least one of the phosphorescent phosphor layers 3 and the red phosphor layers 5 is dot-like, whereby the heat of the light-emitting elements 1 becomes easy to radiate to the outside through the phosphorescent phosphor layers 3 and the red phosphor layers 5 in a similar way to the case where the shape is linear. Therefore, it becomes possible to prevent the overheating of the light-emitting elements 1 and to suppress the brightness unevenness and color unevenness of the light-emitting device 10A.

In a case where the shapes of the phosphorescent phosphor layers 3 and the red phosphor layers 5 are dot-like, it is preferable that the plurality of phosphorescent phosphor layers 3 and the plurality of red phosphor layers 5 be disposed alternately with each other in an up-and-down direction or a left-and-right direction when viewed from the above. As shown in FIG. 3, the phosphorescent phosphor layers 3 and the red phosphor layers 5 are disposed alternately with each other when viewed from the above, whereby the color mixing made by the green light from the phosphorescent phosphor layers 3 and the red light from the red phosphor layers 5 is performed efficiently, and it becomes possible to further suppress the color unevenness of the light-emitting device 10A.

As shown in FIG. 4, in a light-emitting device 10B of this embodiment, it is preferable that the phosphorescent phosphor layers 3 and the red phosphor layer 5 be separated from each other in the vertical direction with respect to the mounting surface 7a for the light-emitting elements 1, and further, the red phosphor layer 5 be disposed closer to the light-emitting elements 1 than the phosphorescent phosphor layers 3 are. That is to say, as shown in FIG. 4, it is preferable that the red phosphor layer 5 seal the plurality of light-emitting elements 1, and further, the phosphorescent phosphor layers 3 be disposed on the red phosphor layer 5.

As mentioned above, the emission spectrum of the green phosphorescent phosphor 2 and the absorption spectrum of the red phosphor 4 partially overlap each other in some case. Therefore, in a case where the phosphorescent phosphor layers 3 are disposed closer to the light-emitting elements 1 than the red phosphor layer 5 is, it is possible that the light radiated from the green phosphorescent phosphor 2 may be absorbed by the red phosphor 4, resulting in reduction of the green light. However, in the case where the red phosphor layer 5 is disposed closer to the light-emitting elements 1 than the phosphorescent phosphor layers 3 are, the light radiated from the red phosphor 4 is less likely to be absorbed by the green phosphorescent phosphor 2. Therefore, it becomes possible to reduce the energy loss caused by the color conversion, and to enhance the light emission efficiency at the time when the light-emitting device 10B turns on as usual. Moreover, the green light having high spectral luminous efficiency in the scotopic vision can be emitted efficiently, and accordingly, it becomes possible to suppress the decrease of the illuminance in the darkness at the time of the afterglow, and to enhance the visibility.

Figure 5:
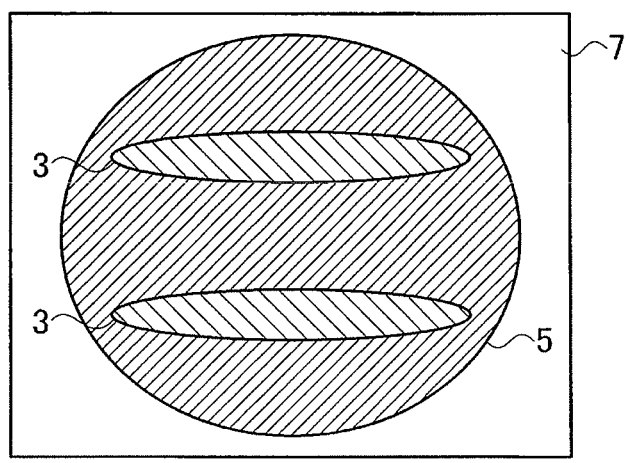
FIG. 5 is a plan view showing a modification example of the light-emitting device.
Figure 6:
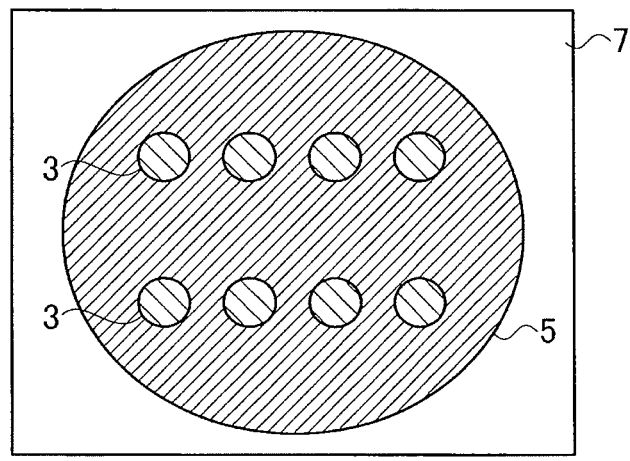
FIG. 6 is a plan view showing a modification example of the light-emitting device.

In the light-emitting device 10B of this embodiment, it is preferable that the phosphorescent phosphor layers 3 and the red phosphor layer 5 be separated from each other in the vertical direction with respect to the mounting surface 7a for the light-emitting elements 1, and further, that the red phosphor layer 5 be dotted with the phosphorescent phosphor layers 3. As shown in FIG. 5 and FIG. 6, the phosphorescent phosphor layers 3 be thus scattered on the red phosphor layer 5, whereby only a part of an upper surface of the red phosphor layer 5 is covered with the phosphorescent phosphor layers 3. Therefore, the light from the red phosphor layer 5 becomes less likely to be absorbed by the phosphorescent phosphor layers 3, and it becomes possible to enhance the light emission efficiency.

In the light-emitting device 10B of this embodiment, it is preferable that the phosphorescent phosphor layers 3 and the red phosphor layer 5 be separated from each other in the vertical direction with respect to the mounting surface 7a for the light-emitting elements 1, and further, that the shape of the phosphorescent phosphor layers 3 be linear or dot-like. As shown in FIG. 5, in the case where the plurality of light-emitting elements 1 are arranged in line to form each element line, first, the whole of the light-emitting elements 1 can be sealed by the red phosphor layer 5, and further, each of the linear phosphorescent phosphor layers 3 can be disposed at a position opposite to the element line. Moreover, as shown in FIG. 6, first, the whole of the plurality of light-emitting elements 1 can be sealed by the red phosphor layer 5, and further, the dot-like phosphorescent phosphor layers 3 can be disposed at positions opposite to the individual light-emitting elements 1. In such a way, the light from the red phosphor layer 5 becomes less likely to be absorbed by the phosphorescent phosphor layers 3, and accordingly, it becomes possible to further enhance the light emission efficiency.

Figure 7:
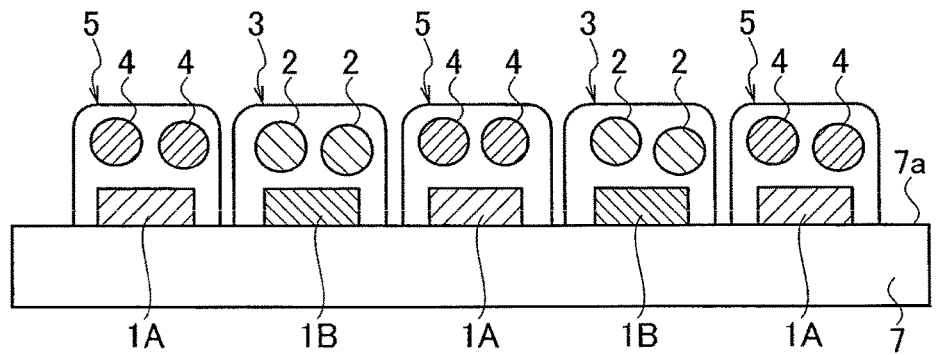
FIG. 7 is a cross-sectional view schematically showing an example of the light-emitting device according to the embodiment of the present invention.

It is preferable that the light-emitting elements 1 include: ultraviolet/violet light emitting diodes which emit light having a light emission peak in a wavelength range of 240 nm or more to 430 nm or less; and blue light emitting diodes which emit light having a light emission peak in a wavelength range of more than 430 nm to 500 nm or less. Moreover, as shown in FIG. 7, it is preferable that the red phosphor layers 5 seal blue light emitting diodes 1A, and that the phosphorescent phosphor layers 3 seal ultraviolet/violet light emitting diodes 1B. The green phosphorescent phosphor 2 in the phosphorescent phosphor layers 3 have a particularly intense absorption peak in a range of 250 nm to 400 nm, and the red phosphor 4 in the red phosphor layers 5 have a broad absorption spectrum in a range of 250 nm to 600 nm. Therefore, such a configuration as shown in FIG. 7 is adopted, whereby it becomes possible to efficiently excite the green phosphorescent phosphor 2 and the red phosphor 4, and to enhance the light emission efficiency.

As described above, each of the light-emitting devices 10, 10A and 10B according to this embodiment includes: the light-emitting elements 1; and the phosphorescent phosphor layer(s) 3, which includes the green phosphorescent phosphor 2 that emits the green light and has the afterglow property and the sealing resin 6 that disperses the green phosphorescent phosphor 2. Moreover, the light-emitting device includes: the red phosphor layer(s) 5, which includes the red phosphor 4 that emits the red light, and the sealing resin 6 that disperses the red phosphor 4, and further, contains only the red phosphor 4 as a phosphor. Such phosphorescent phosphor layers 3 and such red phosphor layers 5 are disposed apart from each other. Then, the light-emitting device emits white light at a time of applying an electric current to the light-emitting elements 1, and emits green light after ending the application of the electric current to the light-emitting elements 1. In such a way, the green light emitted by the green phosphorescent phosphor 2 becomes less likely to be absorbed by the red phosphor 4. Therefore, it becomes possible to reduce the energy loss caused by the color conversion, and to enhance the light emission efficiency at the time when the light-emitting device turns on as usual. Moreover, the green light having high spectral luminous efficiency in the scotopic vision can be emitted efficiently, and accordingly, it becomes possible to suppress the decrease of the illuminance in the darkness at the time of the afterglow, and to enhance the visibility.

[Second Embodiment]

Next, a description is made in detail of a light-emitting device according to a second embodiment based on the drawings. Note that the same reference numerals are assigned to the same constituents as those of the first embodiment, and a duplicate description is omitted.

Figure 8:
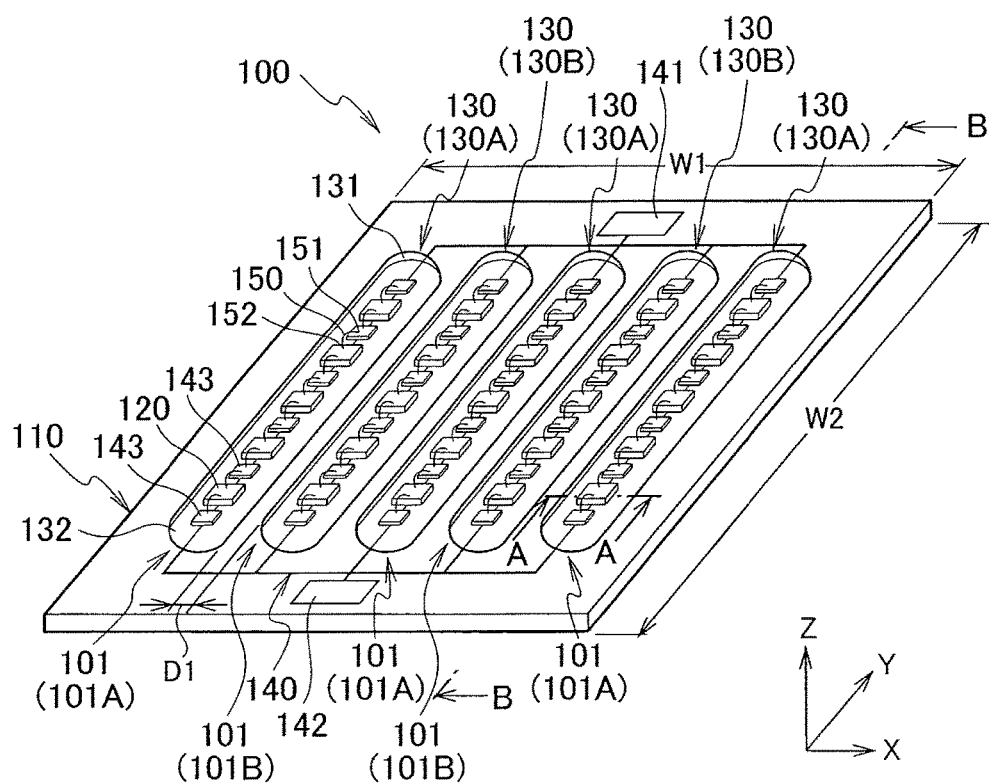
FIG. 8 is a perspective view showing an example of a light-emitting device according to an embodiment of the present invention.

As shown in FIG. 8, a light-emitting device 100 according to this embodiment includes: a substrate 110; a plurality of light-emitting elements 120; and a plurality of sealing members 130. For example, the substrate 110 has a two-layer structure composed of: an insulating layer made of a ceramic substrate, thermally conductive resin and the like; and a metal layer made of an aluminum plate or the like. The substrate 110 is substantially quadrate plate-like, in which a width W1 in a lateral direction (X-axis direction) of the substrate 110 is 12 mm to 30 mm, and a width W2 in a longitudinal direction (Y-axis direction) thereof is 12 mm to 30 mm.

Figure 9A:
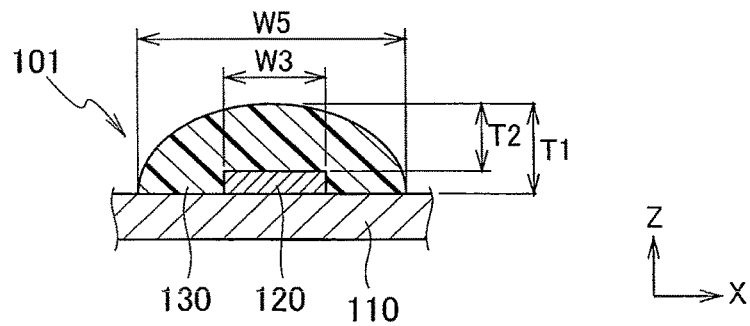
FIG. 9A is a cross-sectional view along a line A-A in FIG. 8.
Figure 9B:
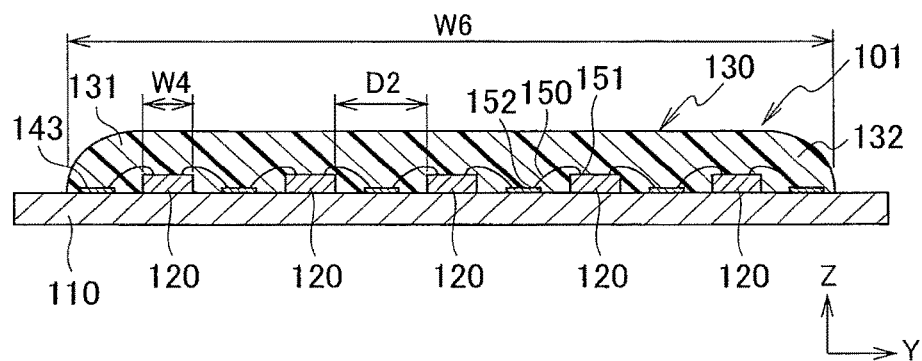
FIG. 9B is a cross-sectional view along a line B-B in FIG. 8.

As shown in FIG. 9A and FIG. 9B, with regard to each of the light-emitting elements 120, a shape thereof when viewed from the above is substantially rectangular. Then, in the light-emitting element 120, a width W3 in a lateral direction (X-axis direction) thereof is 0.3 mm to 1.0 mm, a width W4 in a longitudinal direction (Y-axis direction) thereof is 0.3 mm to 1.0 mm, and a thickness (width in a Z-axis direction) thereof is 0.08 mm to 0.30 mm.

Then, the light-emitting elements 120 are arranged so that the longitudinal direction (Y-axis direction) of the substrate 110 and an array direction of element lines of the light-emitting elements 120 can coincide with each other. The light-emitting elements 120 compose the element lines for each unit of the plurality of light-emitting elements 120 arranged in line, and a plurality of these element lines are mounted by being arrayed along the lateral direction (X-axis direction) of the substrate 110. Specifically, for example, the light-emitting elements 120, of which number is 25, are mounted in a matrix (5 columns×5 rows). That is to say, one element line is composed of five light-emitting elements 120, and five elements lines, each of which is as described, are mounted by being arrayed.

In each of the element lines, the light-emitting elements 120 are linearly arrayed in the longitudinal direction (Y-axis direction). The light-emitting elements 120 are arrayed linearly as described above, whereby the sealing members 130 which seal these light-emitting elements 120 can also be formed linearly.

As shown in FIG. 9B, it is preferable that an interval D2 between the light-emitting elements 120 adjacent to each other along the element line stay within a range of 1.0 mm to 3.0 mm. The interval stays within this range, whereby heat from the light-emitting elements 120 is radiated sufficiently, and it becomes further possible to suppress brightness unevenness caused by the fact that the interval between the light-emitting elements 120 becomes too long.

As shown in FIG. 9B, the respective element lines are individually sealed by the respective linear sealing members 130. Then, one light-emitting group 101 is composed of one element line and one sealing member 130 that seals the element line. Hence, the light-emitting device 100 includes five light-emitting groups 101.

As shown in FIG. 8, it is preferable that a gap distance D1 between the sealing members 130 range from 0.2 mm to 3.0 mm. The gap distance D1 stays within this range, whereby a heat radiation effect brought by providing gaps between the sealing members 130 is obtained sufficiently, and it becomes further possible to suppress brightness unevenness caused by the fact that the gaps between the light-emitting elements 120 become too large.

As shown in FIG. 9A, it is preferable that, with regard to each of the sealing members 130, a width W5 in a lateral direction (X-axis direction) thereof be 0.8 mm to 3.0 mm, and a width W6 in a longitudinal direction (Y-axis direction) thereof be 3.0 mm to 40.0 mm. Moreover, it is preferable that a maximum thickness (width in the Z-axis direction) T1 including a thickness of the light-emitting elements 120 be 0.4 mm to 1.5 mm, and that a maximum thickness T2 that does not include the thickness of the light-emitting elements 120 be 0.2 mm to 1.3 mm. In order to ensure reliability of the sealing, it is preferable that the width W5 of the sealing members 130 be twice to seven times the width W3 of the light-emitting elements 120.

A shape of a cross section of each of the sealing members 130, the cross section going along the lateral direction thereof, is substantially semi-ellipsoidal as shown in FIG. 9A. Moreover, both end portions 131 and 132 in the longitudinal direction of the sealing member 130 have an R shape. Specifically, as shown in FIG. 8, such a shape of both end portions 131 and 132 is substantially semi-circular when viewed from the above, and as shown in FIG. 9B, a shape of cross sections thereof going along the longitudinal direction is a substantially fan-like one having a central angle of approximately 90°. In a case where both end portions 131 and 132 of the sealing member 130 have the R shape as described above, a stress concentration is less likely to occur in both end portions 131 and 132, and in addition, it is easy to take out the light, which is emitted from the light-emitting elements 120, to the outside of the sealing member 130.

The respective light-emitting elements 120 are subjected to face-up mounting on the substrate 110. Then, the respective light-emitting elements 120 are electrically connected to a lighting circuit unit (not shown), which supplies electric power to the light-emitting elements 120, by a wiring pattern 140 formed on the substrate 110. The wiring pattern 140 includes: a pair of electric power-supplying lands 141 and 142; and a plurality of bonding lands 143 arranged at positions corresponding to the respective light-emitting elements 120.

As shown in FIG. 9B, the light-emitting elements 120 are electrically connected to the lands 143 through wires 150, for example, by wire bonding. One end portion 151 of each of the wires 150 is bonded to the light-emitting element 120, and other end portion 152 thereof is bonded to the land 143. The respective wires 150 are individually arranged along the element lines to which the light-emitting elements 120 as connection targets belong. Moreover, both end portions 151 and 152 of the respective wires 150 are also arranged along the element lines. The respective wires 150 are sealed by the sealing members 130 together with the light-emitting elements 120 and the lands 143, and accordingly, are less likely to be deteriorated, and also have high safety since the wires 150 are insulated. Note that a mounting method of the light-emitting elements 120 on the substrate 110 is not limited to such face-up mounting as described above, and may be flip-chip mounting.

As shown in FIG. 8, with regard to the light-emitting elements 120, five thereof belonging to the same element line are connected in series to one another, and five element lines are connected in parallel to one another. Note that a connection mode of the light-emitting elements 120 is not limited to this, and the light-emitting elements 120 may be connected in any mode regardless of the element lines. To the lands 141 and 142, a pair of lead wires of the lighting circuit unit (not shown) is connected, and electric power is supplied from the lighting circuit unit to the respective light-emitting elements through these lead wires and the lands 141 and 142, whereby the respective light-emitting elements 120 emit light.

Figure 10:
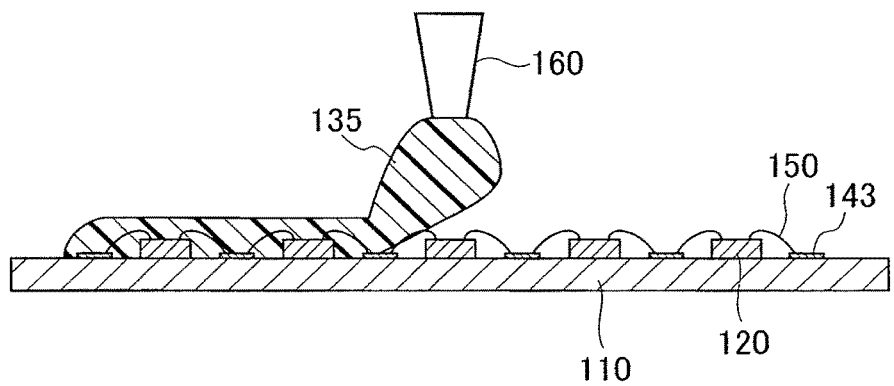
FIG. 10 is a view for explaining a forming method of sealing resin in the light-emitting device.

The sealing members 130 can be formed in such a procedure as follows. First, as shown in FIG. 8, the substrate 110 is prepared, on which the plurality of element lines, each being composed of the plurality of light-emitting elements 120 arranged in line, are mounted by being arrayed in the X-axis direction. Next, as shown in FIG. 10, the substrate 110 is applied with a resin paste 135 along the element lines, for example, by using a dispenser 160. Thereafter, the applied resin paste 135 is solidified, whereby the sealing members 130 can be individually formed for each of the element lines.

As the light-emitting elements 120 in this embodiment, the same ones as the light-emitting elements 1 described in detail in the first embodiment can be used. For example, each of the light-emitting elements 120 can include at least one of an ultraviolet/violet light emitting diode having a light emission peak in a wavelength range of 240 nm or more to 430 nm or less and a blue light emitting diode having a light emission peak in a wavelength range of more than 430 nm to 500 nm or less.

As shown in FIG. 8, the light-emitting device 100 of this embodiment includes: three first light-emitting groups 101A; and two second light-emitting groups 101B. Moreover, the first light-emitting groups 101A and the second light-emitting groups 101B are arranged alternately with each other in the X-direction on the mounting surface of the substrate 110. Each of the first light-emitting groups 101A includes: the plurality of light-emitting elements 120 arranged in line; and the red phosphor layer 5 serving as a sealing member 130A that seals the light-emitting elements 120. Each of the second light-emitting groups 101B includes: the plurality of light-emitting elements 120 arranged in line; and the phosphorescent phosphor layer 3 serving as a sealing member 130B that seals the light-emitting elements 120. As described above, the phosphorescent phosphor layers 3 and the red phosphor layers 5 are separated from each other in the horizontal direction with respect to the mounting surface for the light-emitting elements 120, whereby it becomes easy for the red phosphor 4 to absorb the excitation energy from the light-emitting elements 120, and it becomes possible to enhance the light emission efficiency. Moreover, the green light emitted by the green phosphorescent phosphor 2 becomes less likely to be absorbed by the red phosphor 4, and it becomes possible to enhance the light emission efficiency and the visibility in the darkness.

Figure 11:
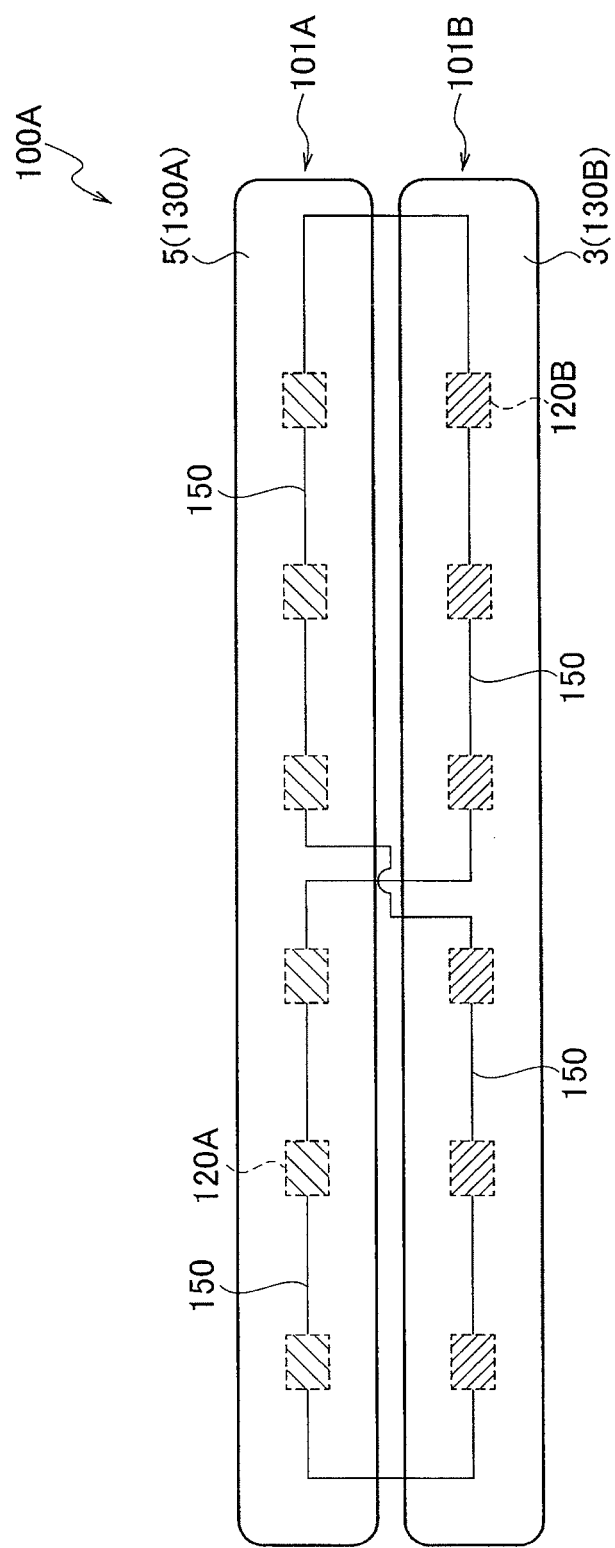
FIG. 11 is a plan view schematically showing an example of the light-emitting device according the embodiment of the present invention.

Here, FIG. 11 shows a modification example of a connection method of the first light-emitting groups 101A and the second light-emitting groups 101B in the light-emitting device 100. Note that, in FIG. 11, the lands 143 disposed between the light-emitting elements 120 are omitted.

A light-emitting device 100A according to this embodiment includes: the substrate 110; and the first light-emitting groups 101A and the second light-emitting groups 101B arranged in an array on the substrate 110. Each of the first light-emitting groups 101A includes: a plurality of blue light emitting diodes 120A arranged in a linear array; and the linear red phosphor layer 5 that seals the plurality of blue light emitting diodes 120A. Moreover, each of the second light-emitting groups 101B includes: a plurality of ultraviolet/violet light emitting diodes 120B arranged in a linear array; and the linear phosphorescent phosphor layer 3 that seals the plurality of ultraviolet/violet light emitting diodes 120B. Moreover, by using a wire 150 provided on the substrate 110, a part of the plurality of blue light emitting diodes 120A and a part of the ultraviolet/violet light emitting diodes 120B are mounted coexistent on one series circuit. The light-emitting device 100A includes a plurality of such series circuits as described above, which are electrically connected in parallel to one another. Then, in all of the series circuits, a ratio of the number of the blue light emitting diodes 120A and the number of the ultraviolet/violet light emitting diodes 120B is the same.

Specifically, in the light-emitting device 100A, in one series circuit, three blue light emitting diodes 120A and three ultraviolet/violet light emitting diodes 120B are directed connected to each other by the wire 150. In FIG. 11, two series circuits, each of which is as described above, are present, and further, these series circuits are connected to each other in such a manner that end portions thereof are connected to each other by the wire 150. Then, these blue light emitting diodes 120A and ultraviolet/violet light emitting diodes 120B are supplied with electric power through the electric power-supplying lands 141 and 142, whereby the blue light emitting diodes 120A and the ultraviolet/violet light emitting diodes 120B emit light.

As described above, the blue light emitting diodes 120A and the ultraviolet/violet light emitting diodes 120B are mounted coexistent on one series circuit, and further, the number of the blue light emitting diodes 120A and the number of the ultraviolet/violet light emitting diodes 120B are equalized with each other, whereby the brightness unevenness and the color unevenness can be suppressed. That is to say, an electric resistance in one series circuit becomes substantially equal to those of the others, and further, an amount of luminescence by the blue light emitting diodes 120A and an amount of luminescence by the ultraviolet/violet light emitting diodes 120B also become equal to each other. Therefore, it becomes possible to suppress the brightness unevenness and color unevenness of the whole of the light-emitting device.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The entire content of Japanese Patent Application No. 2016-011303 (filed on Jan. 25, 2016) is incorporated herein by reference.

What is claimed is:

1. A light-emitting device comprising:
a plurality of light-emitting elements;
a plurality of phosphorescent phosphor layers that includes a green phosphorescent phosphor emitting green light and having an afterglow property, and a sealing resin dispersing the green phosphorescent phosphor; and
a plurality of red phosphor layers that includes a red phosphor emitting red light, and a sealing resin dispersing the red phosphor, wherein the plurality of red phosphor layers contains only the red phosphor as a phosphor and no other phosphor,
wherein the plurality of phosphorescent phosphor layers and the plurality of red phosphor layers are alternately disposed apart from each other about the plurality of light-emitting elements, with one of the plurality of phosphorescent phosphor layers being directly between and adjacent a pair of the plurality of red phosphor layers and one of the plurality of red phosphor layers being directly between and adjacent a pair of the plurality of phosphorescent phosphor layers,
wherein the plurality of phosphorescent phosphor layers includes only the green phosphorescent phosphor and no other phosphor, and
wherein an air gap extends continuously between each of the plurality of phosphorescent phosphor layers and the plurality of red phosphor layers.

2. The light-emitting device according to claim 1, wherein the plurality of phosphorescent phosphor layers and the plurality of red phosphor layers are separated from each other in a horizontal direction with respect to a mounting surface for the plurality of light-emitting elements.

3. The light-emitting device according to claim 2, wherein a shape of at least one of the plurality of phosphorescent phosphor layers or the plurality of red phosphor layers is linear.

4. The light-emitting device according to claim 3, wherein shapes of the plurality of phosphorescent phosphor layers and the plurality of red phosphor layers are linear.

5. The light-emitting device according to claim 2, wherein a shape of at least one of the plurality of phosphorescent phosphor layers or the plurality of red phosphor layers is dot-like.

6. The light-emitting device according to claim 5, wherein shapes of the plurality of phosphorescent phosphor layers and the plurality of red phosphor layers are dot-like, and
when viewed from above, the plurality of the phosphorescent phosphor layers and the plurality of the red phosphor layers are disposed alternately with each other in an up-and-down direction or a left-and-right direction.

7. The light-emitting device according to claim 1, wherein the plurality of phosphorescent phosphor layers and the plurality of red phosphor layers are separated from each other in a vertical direction with respect to a mounting surface for the plurality of light-emitting elements, and
wherein the plurality of red phosphor layers is disposed closer to the plurality of light-emitting elements than the plurality of phosphorescent phosphor layers.

8. The light-emitting device according to claim 7, wherein the plurality of red phosphor layers is dotted with the plurality of phosphorescent phosphor layers.

9. The light-emitting device according to claim 8, wherein a shape of the plurality of phosphorescent phosphor layers is linear or dot-like.

10. The light-emitting device according to claim 1, wherein the plurality of light-emitting elements includes: ultraviolet/violet light emitting diodes which emit light having a light emission peak in a wavelength range of 240 nm or more to 430 nm or less; and blue light emitting diodes which emit light having a light emission peak in a wavelength range of more than 430 nm to 500 nm or less.

11. The light-emitting device according to claim 1, wherein the plurality of light-emitting elements includes: ultraviolet/violet light emitting diodes which emit light having a light emission peak in a wavelength range of 240 nm or more to 430 nm or less; and blue light emitting diodes which emit light having a light emission peak in a wavelength range of more than 430 nm to 500 nm or less, and
wherein the plurality of red phosphor layers seals the blue light emitting diodes, and the plurality of phosphorescent phosphor layers seals the ultraviolet/violet light emitting diodes.

12. The light-emitting device according to claim 3, wherein the plurality of light-emitting elements includes: ultraviolet/violet light emitting diodes which emit light having a light emission peak in a wavelength range of 240 nm or more to 430 nm or less; and blue light emitting diodes which emit light having a light emission peak in a wavelength range of more than 430 nm to 500 nm or less, and
wherein the plurality of red phosphor layers seals the blue light emitting diodes, and the plurality of phosphorescent phosphor layers seals the ultraviolet/violet light emitting diodes.

13. The light-emitting device according to claim 12, further comprising:
a substrate; and
first light-emitting groups and second light-emitting groups arranged in an array on the substrate,
wherein each of the first light-emitting groups includes: a plurality of the blue light emitting diodes arranged in a linear array; and the linear plurality of red phosphor layers that seals the plurality of blue light emitting diodes,
wherein each of the second light-emitting groups includes: a plurality of the ultraviolet/violet light emitting diodes arranged in a linear array; and the linear plurality of phosphorescent phosphor layers that seals the plurality of ultraviolet/violet light emitting diodes,
wherein a part of the plurality of blue light emitting diodes and a part of the plurality of ultraviolet/violet light emitting diodes are mounted coexistent on one series circuit by using a wire provided on the substrate,
wherein a plurality of the series circuits are present, and the plurality of series circuits are electrically connected in parallel to one another, and
wherein in all of the series circuits, a ratio of a number of the blue light emitting diodes and a number of the ultraviolet/violet light emitting diodes is the same.

* * * * *